United States Patent
Tani et al.

[11] Patent Number: 5,251,805
[45] Date of Patent: Oct. 12, 1993

[54] WIRE BONDING METHOD AND APPARATUS

[75] Inventors: Mitsukiyo Tani, Odawara; Akira Gotoh, Hadano; Hideaki Sasaki, Hadano; Hideo Shiraishi, Hadano; Tamotu Kirino, Oyama; Hiroshi Hasegawa, Kanagawa, all of Japan

[73] Assignees: Hitachi, Ltd.; Hitachi Computer Electronics, Co., Tokyo, Japan

[21] Appl. No.: 751,143

[22] Filed: Aug. 28, 1991

[30] Foreign Application Priority Data

Sep. 10, 1990 [JP] Japan .................... 2-239549

[51] Int. Cl.⁵ .................... B23K 31/02; H01L 21/607
[52] U.S. Cl. .................... 228/180.5; 228/111; 228/173.5; 228/1.1
[58] Field of Search ............ 228/111, 1.1, 4.5, 173.5, 228/179

[56] References Cited

U.S. PATENT DOCUMENTS

| | | | |
|---|---|---|---|
| 3,125,803 | 3/1964 | Rich | 228/4.5 |
| 3,734,386 | 5/1973 | Hazel | 228/1.1 |
| 4,817,848 | 4/1989 | Gabaldon | 228/1.1 |
| 5,040,293 | 8/1991 | Yamazaki et al. | 228/4.5 |

FOREIGN PATENT DOCUMENTS

2-101754  4/1990  Japan .

*Primary Examiner*—Samuel M. Heinrich
*Assistant Examiner*—Jeffrey T. Knapp
*Attorney, Agent, or Firm*—Fay, Sharpe, Beall, Fagan, Minnich & McKee

[57] ABSTRACT

A wire bonding method and apparatus for welding a wire with at least one end formed with a ball and a pad of a printed wiring board. A bonding head moves downward slowly to crush the ball to form a flat surface, and will move upward once to adjust a relative position of the pad and the ball. The bonding head will move downward again, and an ultrasonic wave is applied to heat the ball and the bonding head so that the ball and the pad are welded. If necessary, a portion of the wire to be bent is moved to a desired position of the wiring board, by a supporting apparatus. A free end of the wire which is not welded is moved by a jig to bend the portion of the wire for routing.

7 Claims, 10 Drawing Sheets

WIRE BONDING METHOD AND APPARATUS

BACKGROUND OF THE INVENTION

The present invention relates to a wire bonding method and apparatus for bonding a wire to a member to be bonded.

Generally, as a method of bonding a wire having a conducting portion which is not covered by covering material, there is adopted a so-called nailhead bonding method in which a ball is formed on an end of the wire and the ball is pressed on a pad from above by using a bonding head.

Figure 8:
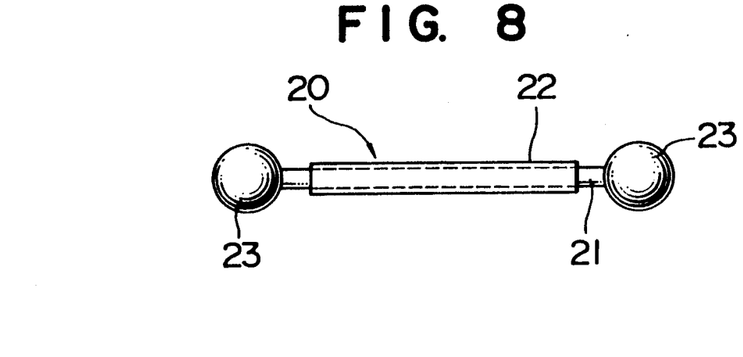
FIG. 8 is a side view showing the whole of a wire.

On the other hand, as shown in FIG. 8, when a wire 20 having a conducting portion 21 covered by a covering member 22 is bonded, the bonding head can not be used, therefore the above-mentioned method can not be used and a method as described in JP-A-2-101754, for example, is adopted.

In this bonding method, balls 23 are first formed at ends of the conducting portion 21 and the ball is held with a pincette by a worker to be put on a pad formed on a board. The ball 23 of the wire 20 is crushed in a moment by a bonding head having an end in which a flat surface is formed and is applied with ultrasonic waves to be heated so that the end of the wire is bonded on the pad.

SUMMARY OF THE INVENTION

It is a first object of the present invention to provide a wire bonding method, a wire bonding apparatus and a wire having less positional deviation in bonding.

It is a second object of the present invention to provide a wire bonding method, using wire bonding apparatus providing having high positioning accuracy in bonding and short manufacturing time.

In any a the conventional bonding methods, since the ball 23 having a diameter of about 150 μm is crushed to a diameter of about 50 μm–100 μm quickly, positional deviation tends to occur. Particularly, when the ball 23 is deformed, an amount of positional deviation often comes up to 50 to 70 μm.

Figure 13:
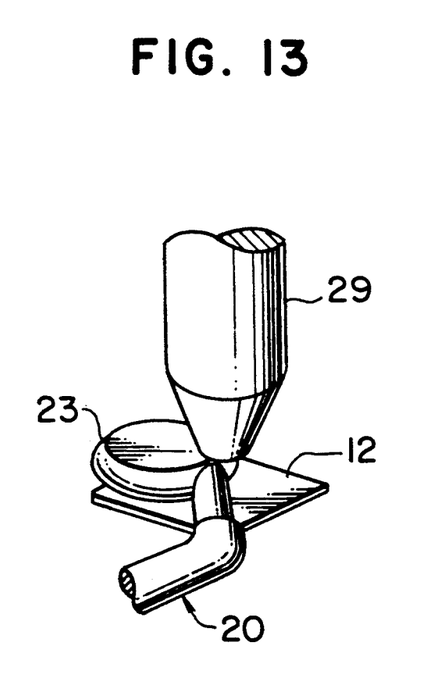
FIG. 13 schematically illustrates a probe test in a prior art.

Accordingly, as shown in FIG. 13, when a probe pin 29 abuts against the bonded ball 23 (to effect an examination with the probe pin), there is the problem that the ball 23 is damaged by the probe pin 29 and reliability in the connection of the wire 20 is degraded.

Further, such positional deviation is a large problem with high-density mounting which requires high working accuracy.

In addition, there is no proper apparatus for bonding a wire having a conducting portion covered by a covering member, and since the wire is pinched with a pincette by a worker and positional alignment of the wire is made by the worker, there is a problem that the accuracy of the positional alignment is degraded and a manufacturing time is longer than necessary.

The present invention has been made in view of the above problems in the prior art to achieve the first and second objects.

A wire bonding method for achieving the first object is characterized by the provision of:

crushing a bond portion of a wire to a member to be bonded to form a flat surface in the bond portion, aligning the wire so that the flat surface comes into contact with a desired position of the member to be bonded, and welding the bond portion of the wire to the member to be bonded.

The bond portion of the wire may be any portion of the wire as long as it is a bond location associated with the member to be bonded and may be not only an end of the wire but also the vicinity of the center of the wire.

An additional wire bonding method for achieving the first object is characterized in that:

aligning the wire so that an end of the wire is aligned to a desired position of the member to be bonded, crushing the end of the wire between a bonding head (for welding the wire to the member) and the member to form a flat portion in the end, then re-aligning it so that the flat portion comes into contact with a desired position of the member. Then the bonding head is abutted against the end of the wire to weld the end and the member to be bonded.

When the head or the member to be bonded is moved to crush the end of the wire therebetween, it is preferable that the movement of the head is made without inertial effects.

A still further wire bonding method for achieving the first object is characterized by the provision of:

aligning the wire so that the previously formed flat portion end of the wire comes into contact with a desired position of the member to be bonded, which is then welded together.

A wire bonding apparatus for achieving the first object is characterized by the provision of:

a flat surface forming means for forming a flat portion at an end of the wire, aligning means for moving at least one of the wires and a member to be bonded to be so aligned that the flat surface at the end of the wire comes into contact with a desired portion of the member to be bonded, and a welding means for welding the end of the wire and the member to be bonded.

A further wire bonding apparatus for achieving the first object is characterized by the provision of:

a bonding head for welding an end of the wire and a member to be bonded, a table on which the member to be bonded is placed, a aligning means for moving at least one of either the bonding head of the table to align so that the member placed on the table is opposed to the bonding head, wire feeding means for feeding the wire to a desired position, and space varying means for varying a space between the bonding head and the table to crush the end of the wire moved above the member placed on the table.

An optimal wire for achieving the first object is characterized to possess conductivity and a flat surface formed at an end thereof.

A wire bonding apparatus for achieving the second object is characterized by the provision of:

wire holding means for holding an end of the wire to keep the end to a desired position on the member to be bonded, and welding means for welding the end of the wire and the member to be bonded.

Further, the second object can be achieved by providing a wire holding means for holding the wire in the wire feeding means of the wire bonding apparatus for achieving the first object.

The various wire bonding apparatuses described above preferably comprise a bend portion holding means for holding a portion of the wire to be bent so that the portion is not moved with respect to the member to be bonded in order to effect exact routing of the wire.

Further, the various wire bonding apparatuses preferably comprise a laser pointer for pointing out the desired position on the member to be bonded with a laser light beam.

The wire is first set in the wire feeding means and the member to be bonded is placed on the table.

Then, at least one of the bonding heads and the table is moved (for alignment) so that the bonding head is opposed to the member to be bonded placed on the table by the aligning means.

The wire is moved by the wire feeding means so that the end of the wire is aligned with the desired position of the member to be bonded.

In this case, if the wire bonding apparatus includes a laser pointer, the desired position of the member is illuminated with a laser beam from the laser pointer to point out the desired position specifically so alignment of the wire is more precisely made.

The space varying means is operated to reduce the space between the bonding head and the table so that the end of the wire is crushed.

After the end of the wire has been crushed, the space between the bonding head and the table is increased so that the end of the wire is aligned with the desired position of the member to be bonded.

When the alignment is completed, the bonding head abuts against the end of the wire on the member placed on the table so that the end of the wire and the bonding head can be welded.

When the end of the wire and the bonding head are welded, no positional deviation occurs because the bonding head abuts against the end of the wire and an amount of positional deviation in the bonding can be reduced.

As described above, after the end of the wire has been bonded, the wire is routed in order to bond a free end thereof.

In the routing of the wire, a portion of the wire to be bent is held by the bend portion holding means, and a simple jig having an end formed into a hook or a manipulator capable of holding the wire is employed to change the direction of the free end of the wire. Thus, the wire is bent exactly from the held portion to be bent so that exact routing is made.

When the wire holding means, which holds the end of the wire in the desired position on the member to be bonded is provided or the wire holding means is provided in the wire feeding means, the wire can be moved to a desired position and held at that position whether the conducting portion of the wire is covered by covering material or not, so that the bonding having less positional deviation can be made in a short time.

According to the present invention, since a flat surface is formed in the bond portion of the wire or the wire having a flat surface previously formed is employed to cause the flat surface to be brought into contact with the desired position of the member to be bonded. This bond portion of the wire and the member to be bonded are then welded. Thus the stability of the bond portion of the wire to the member to be bonded is increased and an amount of positional deviation in the bonding can be reduced.

Further, since there is provided a means for holding the wire, even the wire having the conducting portion with covering material can be treated and the bonding can be made by hand in a short time with high positioning accuracy.

DESCRIPTION OF THE PREFERRED EMBODIMENT

Referring now to FIGS. 1 to 12, embodiments of the present invention are described.

A first embodiment of a wire bonding apparatus is described with reference to FIGS. 1 to 10.

Figure 6:
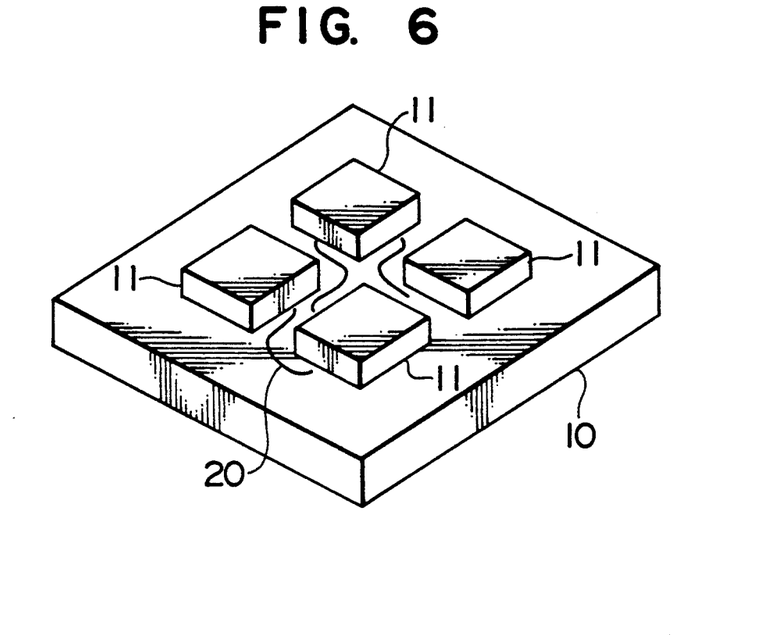
FIG. 6 is a perspective view showing the whole of a multi-layer printed wiring board.
Figure 7:
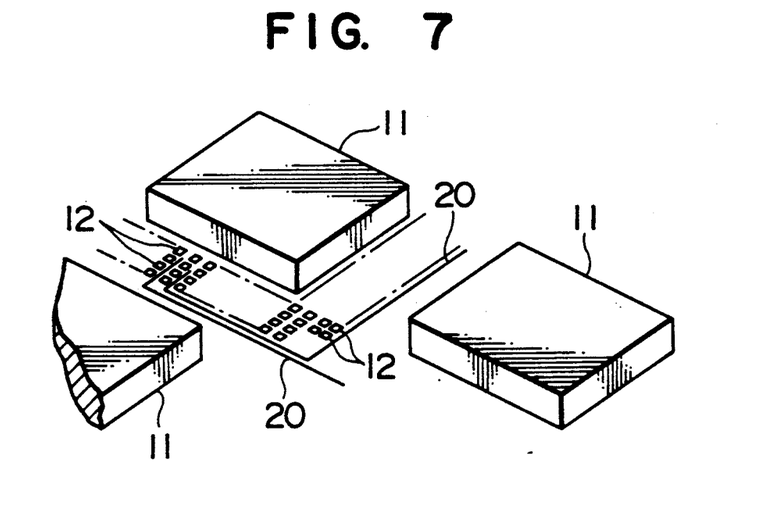
FIG. 7 is a perspective view showing the neighborhood of integrated circuit devices.

As shown in FIGS. 6 and 7, the wire bonding apparatus is to connect wires 20 to bonding pads 12, . . . on a multi-layer printed wiring board on which a plurality of integrated circuit devices 11, for example, are mounted or bonding pads of the integrated circuit devices.

Figure 1:
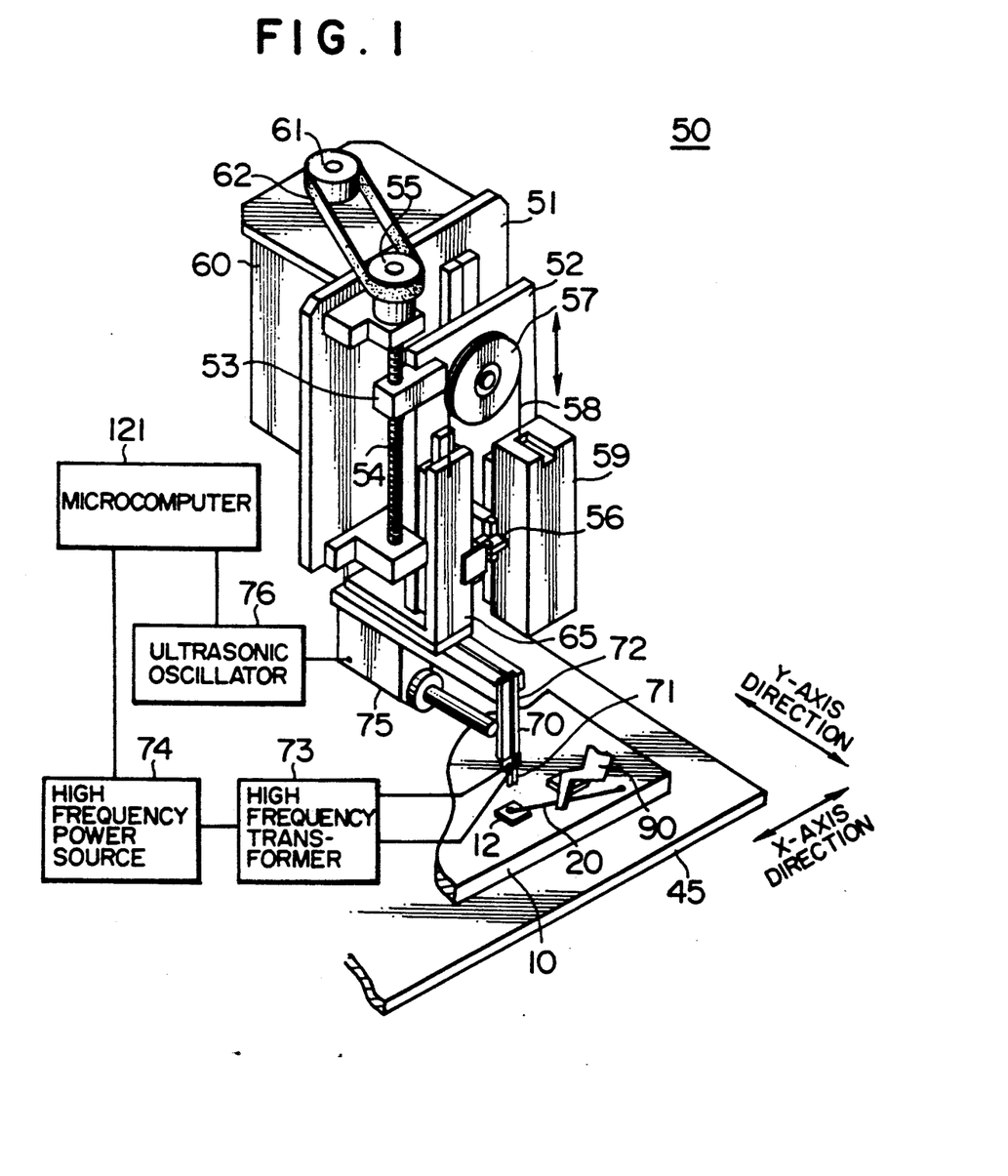
FIG. 1 is a perspective view showing the whole configuration of a head driving mechanism according to the present invention.
Figure 2:
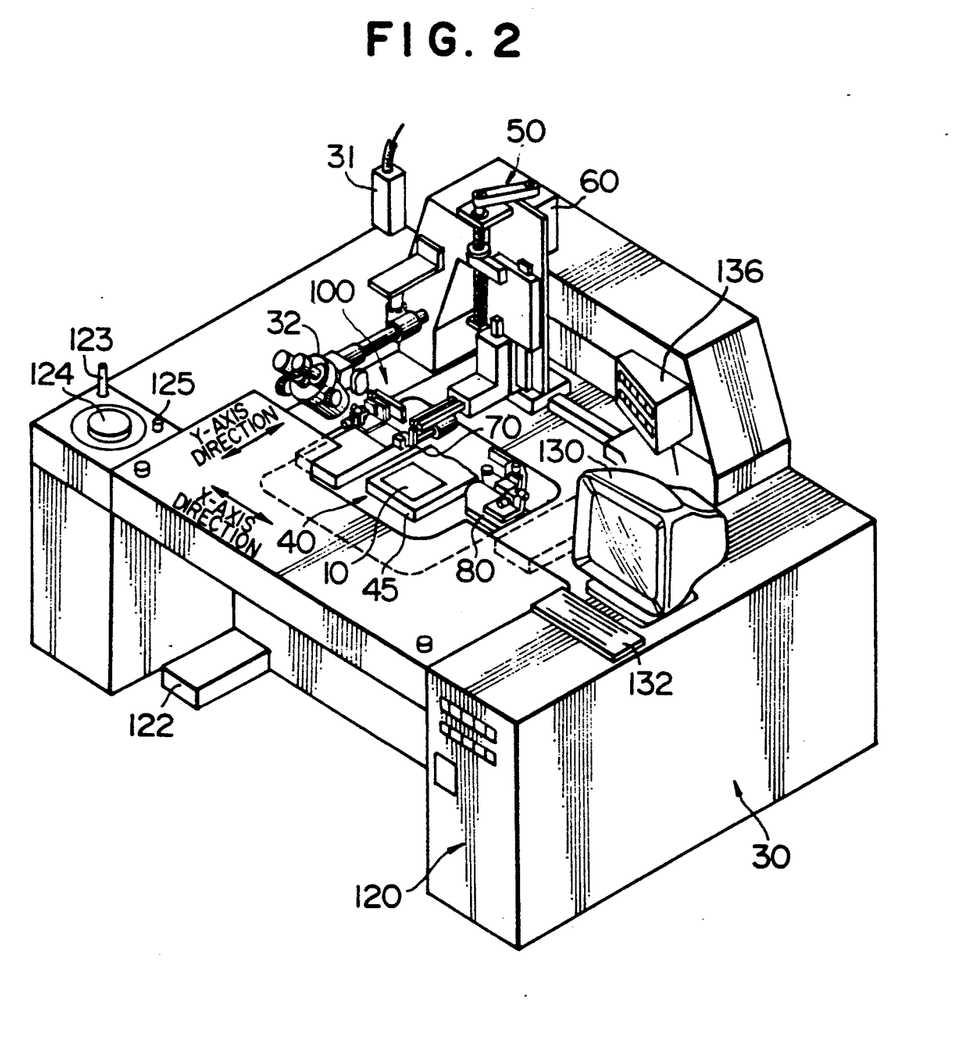
FIG. 2 is a perspective view showing the whole configuration of a wire bonding apparatus according to the present invention.

The wire bonding apparatus comprises, as shown in FIGS. 1 and 2, a base 30 in which various apparatuses are mounted, a table 45 on which a multi-layer printed wiring board 10 is placed, a driving mechanism 40 for moving the table in the X- and Y-axes directions on a horizontal plane, a bonding head 70 for welding the bonding pad 12 and the wire 20, a head driving mechanism 50 for moving the bonding head vertically (the Z-axis direction), a wire feeding mechanism 80 for feeding the wire 20 to a desired position on the multi-layer printed wiring board 10, a bend portion holding mechanism 100 for holding a bend portion of the wire 20, a controller 120 for controlling the mechanisms, a laser pointer 31 for pointing out a desired position on the multi-layer printed wiring board 10 with a laser beam, and a magnifying lens 32 for recognizing a positional relation of the wire 20 and the bonding pad 12.

Figure 5:
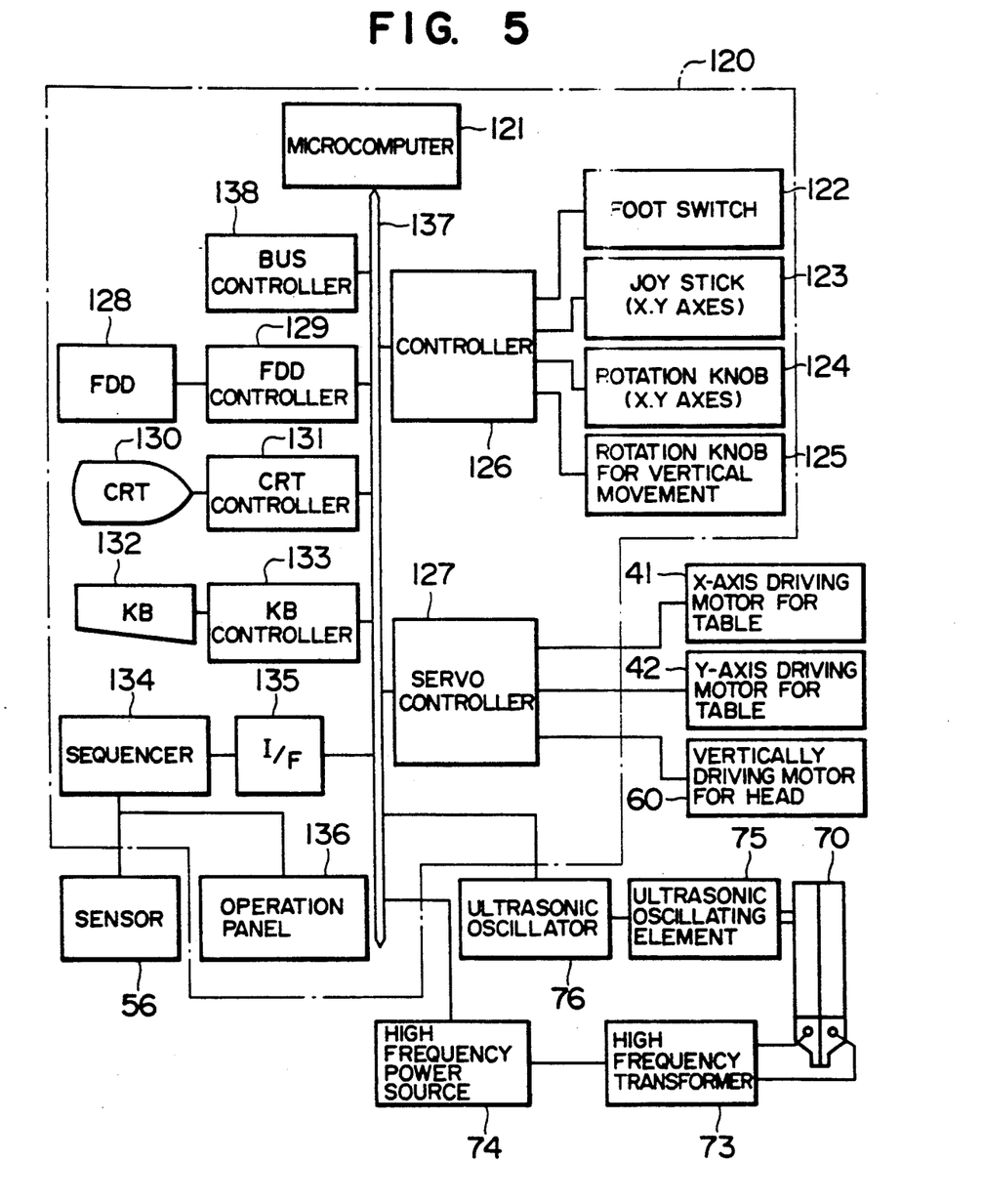
FIG. 5 is a circuit block diagram of a control unit according to the present invention.

As shown in FIG. 5, the driving mechanism 40 comprises an X-axis driving motor 41, a Y-axis driving motor 42, and a mechanism (not shown) for moving the table in the X- and Y-axes directions by the motors 41 and 42.

As shown in FIG. 1, the head driving mechanism 50 comprises a supporting base 51 for supporting a head driving portion, a vertically movable base 52 which is disposed on the supporting base 51 by means of a slide rail to be movable vertically, a driving motor 60 for vertically moving the vertically movable base 52, an ultrasonic oscillating element 75 for applying ultrasonic wave to the bonding head 70, and a slide bracket 65 for supporting the bonding head 70 and the ultrasonic wave oscillating element 75.

A nut member 53 is fixedly mounted to the vertically movable base 52 and a bolt 54 engaged with the nut member 53 is mounted to the supporting base 51 rotatably. A pulley 55 is mounted to an upper end of the bolt 54 and is coupled with a pulley 61 mounted to a shaft of the driving motor 60 through a belt 62. Further, the vertically movable base 52 is provided with a position sensor 56 for detecting a position of the slide bracket 65 with respect to the vertically movable base 52 and a balance pulley 57. A wire 58 is led through the balance pulley and the slide bracket 65 is attached to an end of the wire 58 while a balancer 59 is attached to the other end of the wire 58.

The weight of the balancer 59 is lighter than the total weight of the slide bracket 65, the bonding head 70 and the ultra-sonic oscillating element 75 hanging on the end of the wire 58 and when a difference between the total weight and the weight of the balancer 59 weighs on the ball 23 of the wire 20, the ball 23 can be crushed. Thus, usually, since the balancer 59 is lighter, the balancer 59 is positioned at the most upper position.

The bonding head 70 includes a bonding tip 71 to which a voltage is applied through a high-frequency transformer 73 from a high-frequency power source 74 and a tip holder for holding the tip. The ultrasonic oscillating element 75 is connected to an ultrasonic oscillator 76 and an end of the ultrasonic oscillating element 75 abuts against the tip holder 72.

Figure 3:
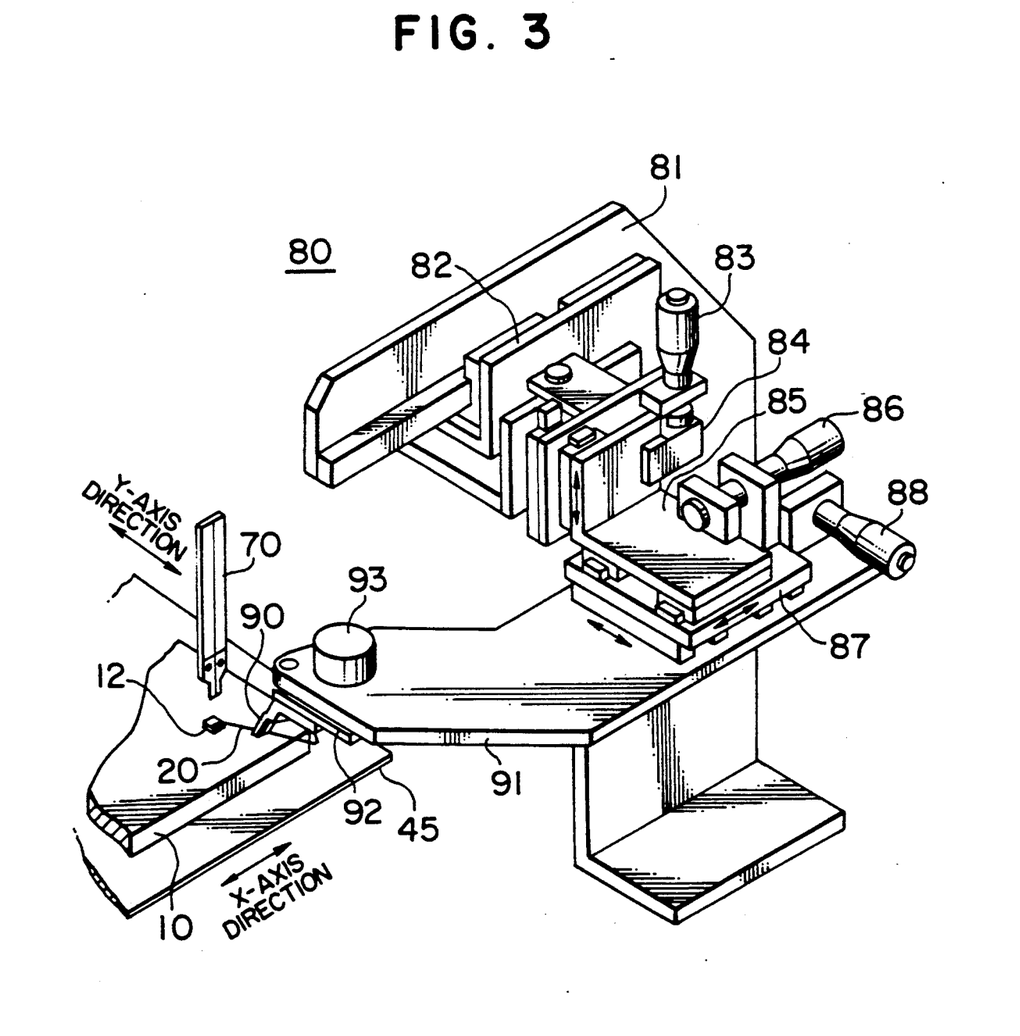
FIG. 3 is a perspective view showing the whole configuration of a wire feeding mechanism according to the present invention.

The wire feeding mechanism 80 includes, for example as shown in FIG. 3, a pincette for holding or pinching the wire 20, a supporting base 81 for supporting a wire feeding portion, a roughly movable slide bracket 82 disposed on the supporting base 81 to be movable roughly in the X-axis direction, a vertically movable slide bracket 85 disposed to be vertically moved to the roughly movable slide bracket 82, an X-axis direction slide bracket 87 disposed in the vertically movable slide bracket 85 to be slidably moved in the X-axis direction, and a pincette bracket 91 disposed in the X-axis direction slide bracket 87 to be slidably moved in the Y-axis direction and to which a pincette 90 is attached.

A vertically movable rotary knob 83 is rotatably mounted to the roughly movable slide bracket 82 and a nut member 84 engaged with the rotary knob 83 is fixedly mounted to the vertically movable slide bracket 85. In the same manner as the roughly movable slide bracket 82, an X-axis direction slidable rotary knob 86 and a Y-axis slidable rotary knob 88 are mounted to the vertically movable slide bracket 85 and the X-axis direction slide bracket 87, respectively.

A fan-shaped sector gear 92 is disposed in an end of the pincette bracket 91 so that the sector gear 92 can be moved rotatably about a center of the fan and the pincette 90 is attached to the sector gear 92. A gear is formed in an arcuated portion of the sector gear 92 and is engaged with a gear (not shown) formed at an end of the pincette rotating knob 93.

Figure 4:
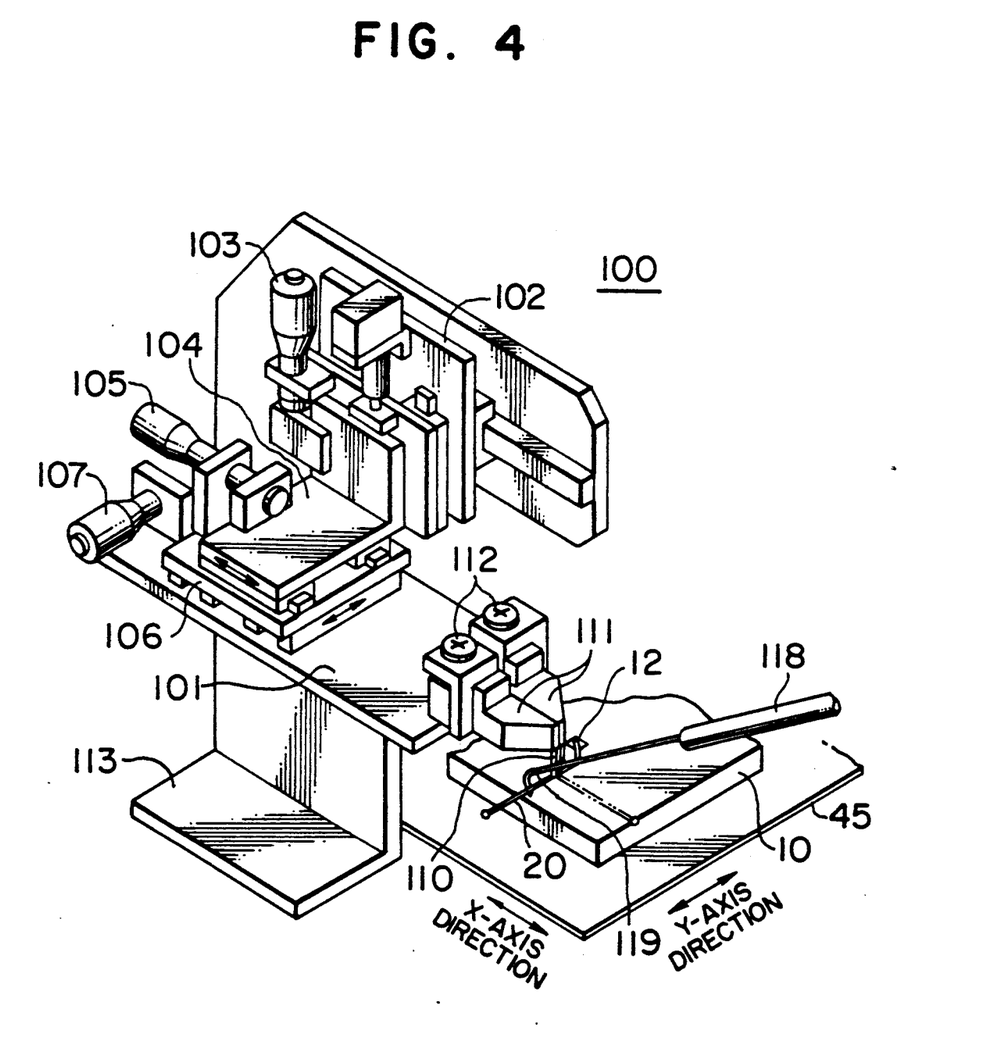
FIG. 4 is a perspective view showing the whole configuration of a bend portion holding mechanism according to the present invention.

As shown in FIG. 4, the bend portion holding mechanism 100 includes two assist pins 110 for holding the bend portion of the wire 20, an assist pin blocks 111 for fixing the assist pins 110, and a vertically moving cylinders 112 for vertically moving the assist pins 110 together with the assist pin blocks 111. With respect to the other structure, in the same manner as the wire feeding mechanism 80, there is provided a holding portion supporting base 101, a roughly movable slide bracket 102, a vertically movable rotary knob 103, a vertically movable slide bracket 104, an x-axis direction slidably rotary knob 105, an X-axis direction slide bracket 106, a Y-axis direction slidable rotary knob 107, and an assist pin bracket 113 disposed in the X-axis direction slide bracket 106 slidably in the Y-axis direction and to which vertically movable cylinders 112 are mounted.

As shown in FIG. 5, the controller 120 comprises a microcomputer 121 for controlling various circuits, a foot switch 122 for directing predetermined operations such as an initial movement of the table 45, a joystick 123 for directing an amount of rough movement and a moving direction of the table 45, a rotary knob 124 for the X and Y axes for directing an amount of fine movement and a moving direction of the table 45, a vertical movement knob 125 for directing an amount of vertical movement of the bonding head 70, a servo controller 127 for controlling the X-axis driving motor 41 for the table, the Y-axis driving motor 42 for the table and the vertically moving motor 60 for the head, a floppy disk unit 128 and a floppy disk controller 129, a display unit 130 and a display controller 131, a key board 132 and a key board controller 133, an operation panel 136 for setting an initial condition and the like of the apparatus, and a sequencer 134 and an interface 135.

Flat surface forming means includes the head driving mechanism 50 and the bonding head 70, aligning means includes the driving mechanism 40 for driving the table in the X- and Y-axes directions and the wire feeding mechanism 80, and welding means includes the bonding head 70, the high-frequency transformer 73, the high-frequency power source 74, the ultrasonic oscillating element 75 and the ultrasonic oscillator 76.

Figure 10:
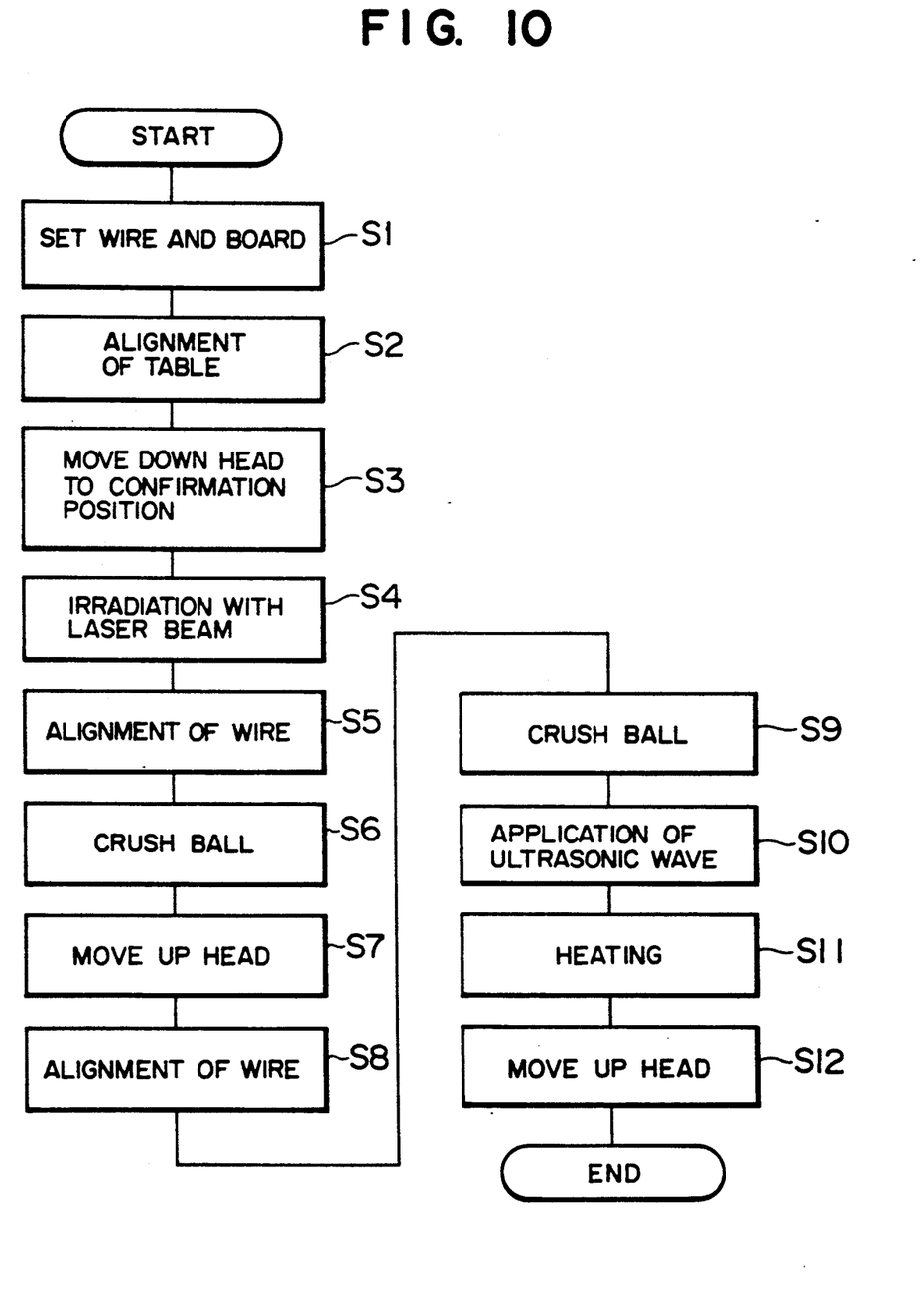
FIG. 10 is a flow chart showing the wire bonding process in the present invention.

Operation of the wire bonding apparatus is now described with reference to a flow chart shown in FIG. 10.

The wire 20 is first attached to the pincette 90 of the wire feeding mechanism 80 and the multi-layer printed wiring board 10 is placed on the table 45 (step 1).

Then, the foot switch 122 is pushed to move the table 45 to the vicinity of a desired position. The joystick 123 and the rotation knob 125 for the X- and Y-axes are operated to move the table 45 so that the bonding head 70 is moved above the middle of a desired bonding pad exactly (step 2).

Figure 9A:
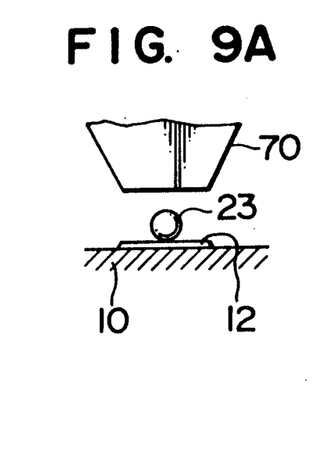
FIGS. 9A to 9D schematically illustrate the wire bonding process in the present invention.

The rotation knob 125 for vertical movement is operated to move the head 70 down to a confirmation position as shown in FIG. 9A (step 3). The confirmation position is a position in which a small gap is formed between the ball 23 of the wire 20 and the head 70 to confirm a relative positional relation of the desired pad 12 and the head 70 even when the ball 23 is placed on the multi-layer printed wiring board 10. The head 70 is moved down by rotating the bolt 54 of the head driving mechanism 50 by the vertically driving motor 60. When the bolt 54 is rotated, the nut member 53 is moved down to thereby move the vertically moving base 52, the slide bracket 65 and the head 70 downward.

When the head 70 has been moved down to the confirmation position, the laser pointer 31 is operated to illuminate the middle of the pad 12 with the laser beam (step 4).

The rotation knobs 83, 86 and 88 of the wire feeding mechanism 80 are operated to bring the ball 23 of the wire 20 held by the pincette 90 into contact with the position of the pad 12 illuminated with the laser beam (step 5).

Figure 9B:
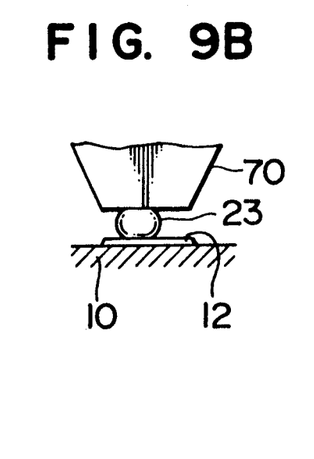

Thus, when the wire 20 has been aligned, the head 70 is then moved down slowly from the confirmation position while observing through the magnifying lens 32, so that the ball 23 is crushed by the head 70 as shown in FIG. 9B (step 6).

In this case, the vertically movable base 52 of the head driving mechanism 50 is moved down at a speed of 0.6 m/s or less and the head 70 is also moved down slowly at the same speed as that of the vertically movable base 52 so that the force of inertia does not occur until the head 70 is brought into contact with the ball 23. The weight of the head 70 is, for example, 100 to 400 grams. In a preferred embodiment, the weight of the head is set to 180 to 220 grams and the speed of the vertically movable base 52 is set to 0.033±0.1 m/s. Since the head 70 is brought into contact with the ball 23 very slowly, a deviation in a position of the ball 23 is small and shock to the pad 12 is also small.

When the head 70 is brought into contact with the ball 23, the head 70 is disposed so that the head can be moved vertically with respect to the vertically movable base 52 even if the vertically movable base 52 is moved down. Accordingly, the head 70 is moved up relatively to the vertically movable base 52 together with the slide base 65.

The differential weight between the total weight of the slide bracket 64, the bonding head 70 and the ultrasonic oscillating element 75 and the weight of the balancer 59 weighs on the ball 23, so that the ball 23 is crushed. While the ball 23 is crushed by the head 70, the head 70 is moved up with respect to the vertically movable base 52 but the head is moved down with respect to the pad 12.

Figure 9C:
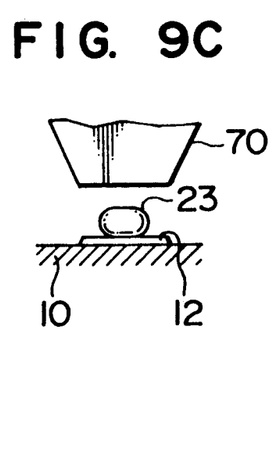

When the ball 23 having a diameter of, for example, about 150 μm is crushed to a diameter of about 50 μm–100 μm, the head 70 is moved up once as shown in FIG. 9C (step 7), and the wire feeding mechanism 80 is operated to align the ball 23 with the middle of the pad 12 again (step 8). This is because a positional deviation may occur even if the head 70 is brought into contact with the ball 23 slowly in the case where the ball 23 is deformed when the ball 23 is crushed.

Figure 9D:
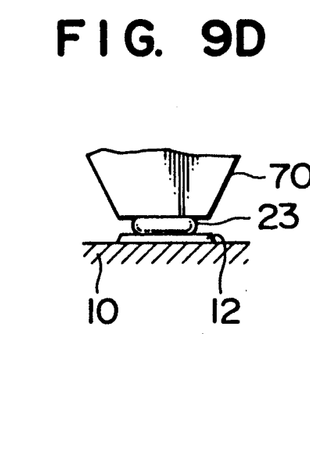

When the alignment of the ball 23 has been finished, the head 70 is moved down to further crush the ball 23 as shown in FIG. 9D (step 9).

When the fine wiring is made, since the positional deviation is increased when the ball 23 is crushed once in the step 6, the crushing operation is made in the steps 6 and 9. If a predetermined crush amount is attained with predetermined positional accuracy only by the step 6, the crushing operation in the step 9 may be omitted.

While the ball 23 is in contact with the head 70, the foot switch 122 is pushed to operate the ultrasonic oscillator 76 and the high-frequency electric power 74 so that ultrasonic wave is applied to the ball 23 (step 10) and the ball 23 is heated (step 11) to weld the ball 23 and the pad 12. An exact timing of the application of the ultrasonic wave and the heating is determined on the base of a signal produced by the positional sensor 56 disposed in the vertically movable base 52. The application of the ultrasonic wave is to form a new surface in a contact surface between the ball 23 and the pad 12 by means of oscillation by the ultrasonic wave to increase the connection strength between the ball 23 and the pad 12.

When the ball 23 and the pad 12 have been welded, the head 70 and the wire feeding mechanism 80 are evacuated (step 12).

Thus, the bonding between the ball 23 formed at the end of the wire 20 and the pad 12 is completed.

When the ball 23 formed at the end of the wire has been bonded to the pad, it is necessary to reroute the wire 20 so the ball 23 formed at a free end of the wire.

The routing is performed by using the bend portion holding mechanism 100 and a hook-shaped jig 118 as shown in FIG. 4.

A portion of the wire 20 to be bent is held between the assist pins 110 of the bend portion holding mechanism 100. The various rotation knobs 103, 105 and 107 of the bend portion holding mechanism 100 are operated to move the assist pins 110 so that the bend portion of the wire 20 is moved to a desired position on the multi-layer printed wiring board 10.

In this state, the free end of the wire 20 is hooked by a hook 119 of the hook-shaped jig 118 and the wire 20 is bent to effect the routing. The portion of the wire 20 to be bent can be held to the desired position by the assist pins 110 exactly, and accordingly the wire 20 can be bent to effect the exact routing. The routing can be effected with the positional accuracy of, for example, 30 μm by using the present invention.

When the routing is completed, the ball 23 at the free end of the wire is bonded to the pad by repeating the processes shown in the steps 1 to 12.

According to the present embodiment, since the ball 23 is aligned with the pad 12 and the ball 23 and the pad 12 are welded after the ball 23 has been crushed once to form a flat surface on the ball 23 on the side of the pad 12, the positional deviation of the ball 23 can be greatly reduced.

Further, since the wire feeding mechanism 80 is provided with the pincette 90 constituting the wire holding means, the wire can be held whether the conducting portion 21 of the wire 20 is covered by the covering material 22 in the embodiment or not, so that the bonding can be made with high positioning accuracy.

In addition, since the bend portion holding mechanism 100 is provided, the routing can be made precisely.

Figure 11:
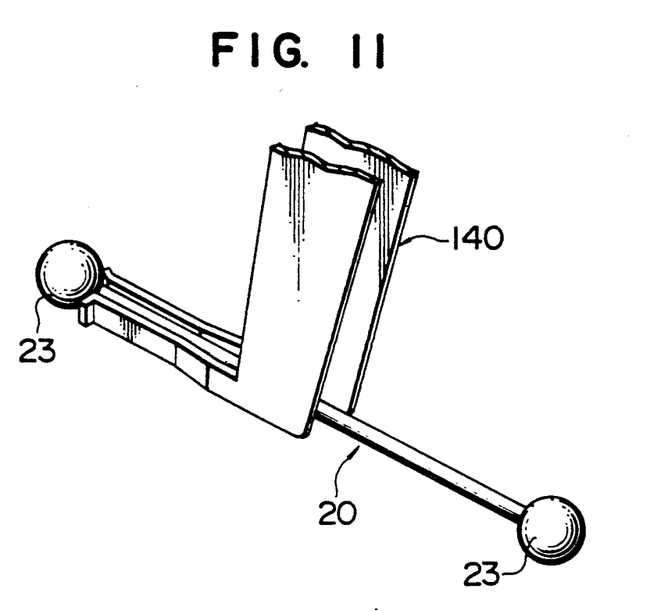
FIG. 11 is a perspective view showing a portion of a wire honding tool according to a second embodiment of the present invention.

A second embodiment of the present invention is now described with reference to FIG. 11.

The second embodiment includes a wire holding jig 140 for holding part of the ball 23 together with the conducting portion 21 of the wire 20 instead of the pincette 90 of the wire feeding mechanism 80 shown in FIG. 3. The bonding apparatus of the embodiment has the same configuration as that of the first embodiment except that the wire holding jig 140 is provided instead of the pincette 90.

In this manner, since the ball 23 can be held in the middle of the pad 12 by the provision of the wire holding jig 140, the positional deviation in the welding can be minimized even if the ball 23 is not crushed once.

A third embodiment of the present invention is now described with reference to FIG. 12.

Figures 12A, 12B:
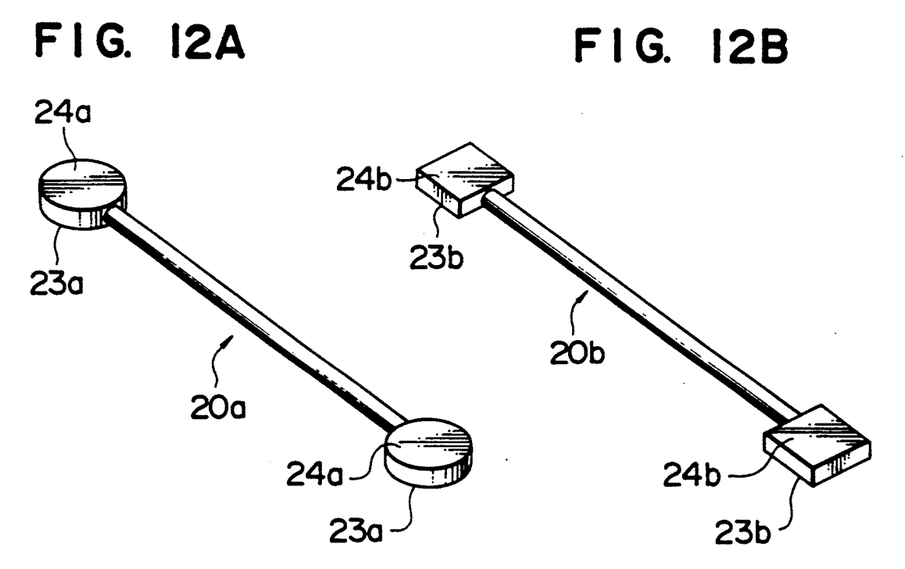
FIGS. 12A and 12B are perspective views showing the whole of wires according to a third embodiment of the present invention.

In the embodiment, as shown in FIG. 12, wires 20a and 20b each having two flat surfaces 24a and 24b parallel to each other and formed in balls 23a and 23b, respectively, are bonded to the pads by using the wire bonding apparatus shown in the first embodiment.

According to the present embodiment, not only the same effects as those of the first embodiment can be obtained but also the processes in the steps 5 to 7 of the first embodiment can be omitted to shorten the bonding time.

Further, the wire includes a wire having conductive material compounded on plastic resin and a wire having conductive foil bonded on plastic resin.

We claim:

1. A wire bonding method comprising:
   a step of placing a wiring board having a bonding pad on a table and setting a wire having at least one end of which is a ball in a wire feeding apparatus;
   a step of moving at least one of said table and a bonding head for welding said bonding pad to said ball to adjust a relative position of said bonding head and the bonding pad;
   a step of bringing said ball into contact with said bonding pad by using said wire feeding apparatus;
   a step of moving said bonding head downward at a low speed to crush said ball to form a flat surface in said ball;
   a step of moving said bonding head upward once;
   a step of adjusting the relative position of said bonding pad and the ball by using said wire feeding apparatus; and
   a step of moving said bonding head downward to bring said bonding head into contact with said ball and applying an ultrasonic wave to said ball to heat said ball so that said ball is welded to said bonding pad.

2. The wire bonding method according to claim 1, wherein a relative speed of said bonding head to said bonding pad in the step of moving said bonding head downward to crush said ball is 0.5 m/sec or less.

3. The wire bonding method according to claim 1, further comprising:
   a step of supporting a portion to be bent of said wire having said ball welded to said bonding pad by means of a bend portion supporting apparatus and moving said portion to be bent of said wire to a predetermined position on said multi-layer wiring board; and
   a step of moving a free end of said wire which is not welded by using a jig to bend said portion to be bent for routing of said wire.

4. A wire bonding method of bonding a wire to a member to be bonded, comprising:
   aligning an end of said wire with a desired position on said member to be bonded;
   crushing the end of said wire between a bonding head for welding said wire to said member to be bonded and said member to be bonded to form a flat surface at the end of said wire; and
   re-aligning said flat surface at the end of said wire with said desired position on said member to be bonded so that said flat surface is brought into contact with said desired position; and
   abutting said bonding head against the end of said wire so that said end of said wire is welded to said member to be bonded.

5. The bonding method according to claim 4, wherein when at least one of said head and said member to be bonded is moved to crush said wire, the movement is made at a speed of 0.6 m/sec or less so that inertial forces are limited.

6. The wire bonding method according to claim 4, wherein a wire having an end previously formed with a flat surface is aligned so that said flat surface is brought into contact with the desired position on said member to be bonded and the end of said wire and said member to be bonded are then welded.

7. The wire bonding method according to claim 4, comprising holding said wire so that the end of said wire is not moved with respect to said member to be bonded at least when the end of said wire and said member to be bonded are welded.

* * * * *